United States Patent [19]
Yasunaga et al.

[11] Patent Number: 5,609,514
[45] Date of Patent: Mar. 11, 1997

[54] WAFER CHAMFERING MACHINE

[75] Inventors: Masaaki Yasunaga; Takeshi Kagamida, both of Mitaka, Japan

[73] Assignee: Tokyo Seimitsu Co., Ltd., Tokyo, Japan

[21] Appl. No.: 337,498

[22] Filed: Nov. 8, 1994

[30] Foreign Application Priority Data

Nov. 16, 1993 [JP] Japan ................................ 5-311351

[51] Int. Cl.⁶ ................................................ B24B 9/06
[52] U.S. Cl. ........................................... 451/65; 451/44
[58] Field of Search ............................. 451/44, 43, 65, 451/57, 5, 14, 143, 144, 201, 210

[56] References Cited

U.S. PATENT DOCUMENTS

| | | | |
|---|---|---|---|
| 5,289,661 | 3/1994 | Jones et al. | 451/44 |
| 5,295,331 | 3/1994 | Honda et al. | 451/44 |
| 5,317,836 | 6/1994 | Hasegawa et al. | 451/44 |
| 5,445,554 | 8/1995 | Hosokawa | 451/44 |

FOREIGN PATENT DOCUMENTS

| | | | |
|---|---|---|---|
| 2-30464 | 1/1990 | Japan. | |
| 2087523 | 3/1990 | Japan | 451/44 |
| 2126008 | 3/1984 | United Kingdom | 451/44 |

*Primary Examiner*—Robert A. Rose
*Attorney, Agent, or Firm*—Oliff & Berridge

[57] ABSTRACT

There is provided a wafer chamfering machine, wherein chamfering of a notch of a wafer can be accurately performed the space of the wafer chamfering machine is compact size, the costs are reduced and the time required for chamfering is shorten. In a wafer chamfering machine, wherein a rotatable wafer table and a rotatable grindstone for working on the outer periphery are made relatively vertically and horizontally movable the wafer is held on the wafer table, relative vertical positions between the wafer table and the grindstone for working on the outer periphery are set, and the wafer table and the grindstone for working on the outer periphery are made to relatively approach each other with the wafer table and the grindstone for working on the outer periphery being rotated, to thereby chamfer the outer periphery of the wafer, a notch chamfering work unit is provided on the side of the wafer table of a grindstone shaft receiving rack of the grindstone for working on the outer periphery at a position not interfering with the grindstone for working on the outer periphery, whereby, after chamfering the outer periphery of the wafer, chamfering of the notch is performed on the same wafer table.

9 Claims, 5 Drawing Sheets

WAFER CHAMFERING MACHINE

BACKGROUND OF THE INVENTION

1. Field of the Invention

This invention relates to a wafer chamfering machine for performing chamfering work on a wafer such as silicon serving as a raw material for a semiconductor element, and more particularly to a wafer chamfering machine, in which chamfering of the outer periphery and a notch of the wafer is performed by the same wafer chamfering machine.

2. Description of the Related Art

The wafer such as silicone serving as the raw material for the semiconductor element is produced in a way that the wafer is cut into a thin piece from a state of an ingot, and thereafter, the outer periphery thereof is chamfered by use of a wafer chamfering machine. Furthermore, there is a case where a notch is formed in the wafer in association with the direction of a crystal of silicone and also chamfering is performed on this notch.

FIG. 2 shows an outer appearance of the wafer provided therein with the notch. In FIG. 2, designated at D is the diameter of the outer periphery 11 of the wafer, $\alpha$ an opening angle of a notch 12, $\delta$ an inclination of the center of the notch 12 to the center of the outer periphery 11 of the wafer and L is a distance from the outer periphery 11 of the wafer to the notch 12 (A circle shown at the portion of the notch 12 is the circle representing the measured value, but not a part of the wafer).

Furthermore, FIG. 3 shows chamfering shapes required for the outer periphery 11 and the notch 12 of the wafer.

FIG. 3 shows that Bu and Bd are widths of chamfering; $\theta u$ and $\theta d$ are tapered angles; Ru and Rd have curved corners and t has a flat outer periphery (not pointed). T is a thickness of the wafer. As grindstones for chamfering work, a trapezoidal type grindstone 31 is used as shown in FIG. 4 or a formed grindstone 51 shown in FIG. 5. The dimensions and shapes shown in FIGS. 2 and 3 have tolerances, and, when the dimensions and shapes come off the tolerances, defectives will be resulted.

Methods of performing the chamfering work shown in FIGS. 2 and 3 include a method of performing the chamfering work by use of a chamfering machine specialized for chamfering the outer periphery and a chamfering machine specialized for chamfering the notch and another method of chamfering by use of a chamfering machine for chamfering the outer periphery, which is separately provided therein with a notch chamfering work station.

However, the conventional chamfering method presents a problem in that, since it is difficult to accurately position the notch 12 relative to the diameter D of the outer periphery 11 of the wafer, it is difficult to accurately perform chamfering work of the dimensions and shapes of the notch 12 relative to the diameter D of the outer periphery 11 of the wafer. Furthermore, there is another problem in that, since the separate chamfering machines are required required the work station, is required separately, the space for the chamfering machine or machines is increased in size the cost is increased. Further, there is another problem in that, since the works are required twice for mounting the wafer to a wafer table for positioning, vacuum drawing and the like and for removing the wafer from the wafer table after completion of work, much time is required for performing each procedure.

SUMMARY OF THE INVENTION

The present invention has been developed to eliminate the above-described problems and has as its object the provision of a wafer chamfering machine, in which chamfering of the notch 12 relative to the outer periphery 11 of the wafer can accurately be performed, the space of the chamfering machine is compact in size and the costs are reduced and the time required for the chamfering is shorten.

To achieve the above-described object, the present invention is characterized by comprising:

a wafer holding unit provided with a wafer table for holding a wafer and a motor for drivably rotating the wafer table;

a vertical direction moving mechanism for moving the wafer holding unit in the vertical direction;

a chamfering unit opposed to the wafer holding unit and provided with a grindstone for working on the outer periphery for chamfering the outer periphery of the wafer and a motor for drivably rotating the grindstone for working on the outer periphery;

a notch chamfering work unit provided integrally on the chamfering unit, positioned at a position not interfering with the grindstone for working on the outer periphery, and provided with a notch working grindstone for chamfering a notch formed on the outer periphery of the wafer and a motor for drivably rotating the notch working grindstone; and a horizontal direction moving mechanism for moving the chamfering unit and the notch chamfering work unit toward the wafer holding unit in the horizontal direction.

To achieve the above-described object, the present invention is characterized by comprising:

a wafer holding unit provided with a wafer table for holding a wafer and a motor for drivably rotating the wafer table;

a chamfering unit opposed to the wafer holding unit and provided with a grindstone for working on the outer periphery for chamfering the outer periphery of the wafer and a motor for drivably rotating the grindstone for working on the outer periphery;

a notch chamfering work unit provided integrally on the chamfering unit and provided with a notch working grindstone disposed at a position not interfering with the grindstone for working on the outer periphery for chamfering a notch formed on the outer periphery of the wafer and a motor for drivably rotating the notch working grindstone;

a vertical direction moving mechanism for moving the chamfering unit and the notch chamfering work unit in the vertical direction; and a horizontal direction moving mechanism for moving the wafer holding unit toward the chamfering unit and the notch chamfering work unit in the horizontal direction.

To achieve the above-described object, the present invention is characterized by comprising:

a wafer holding unit provided with a wafer table for holding a wafer and a motor for drivably rotating the wafer table;

a vertical direction moving mechanism for moving the wafer holding unit in the vertical direction;

a chamfering unit opposed to the wafer holding unit and provided with a grindstone for working on the outer periphery for chamfering the outer periphery of the wafer and a motor for drivably rotating the grindstone for working on the outer periphery;

a notch chamfering work unit provided integrally on the chamfering unit and provided with a notch working grindstone disposed at a position not interfering with the grindstone for working on the outer periphery for chamfering a notch formed on the outer periphery of the wafer and a motor for drivably rotating the notch working grindstone; and a horizontal direction moving mechanism for moving the wafer holding unit toward the chamfering unit and the notch chamfering work unit in the horizontal direction.

Furthermore, the notch is chamfered by simultaneously controlling an angle of rotation of the wafer table and a distance between the center of rotation of the wafer table and the center of rotation of the notch performing grindstone of the notch chamfering work unit.

According to the present invention, chamfering of the outer periphery of the wafer and chamfering of the notch can be performed by mounting the wafer to the wafer table only once.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DESCRIPTION OF THE PREFERRED EMBODIMENTS

Detailed description will hereunder be given of the preferred embodiments of a wafer chamfering machine according to the present invention with reference to the accompanying drawings.

Figure 1:
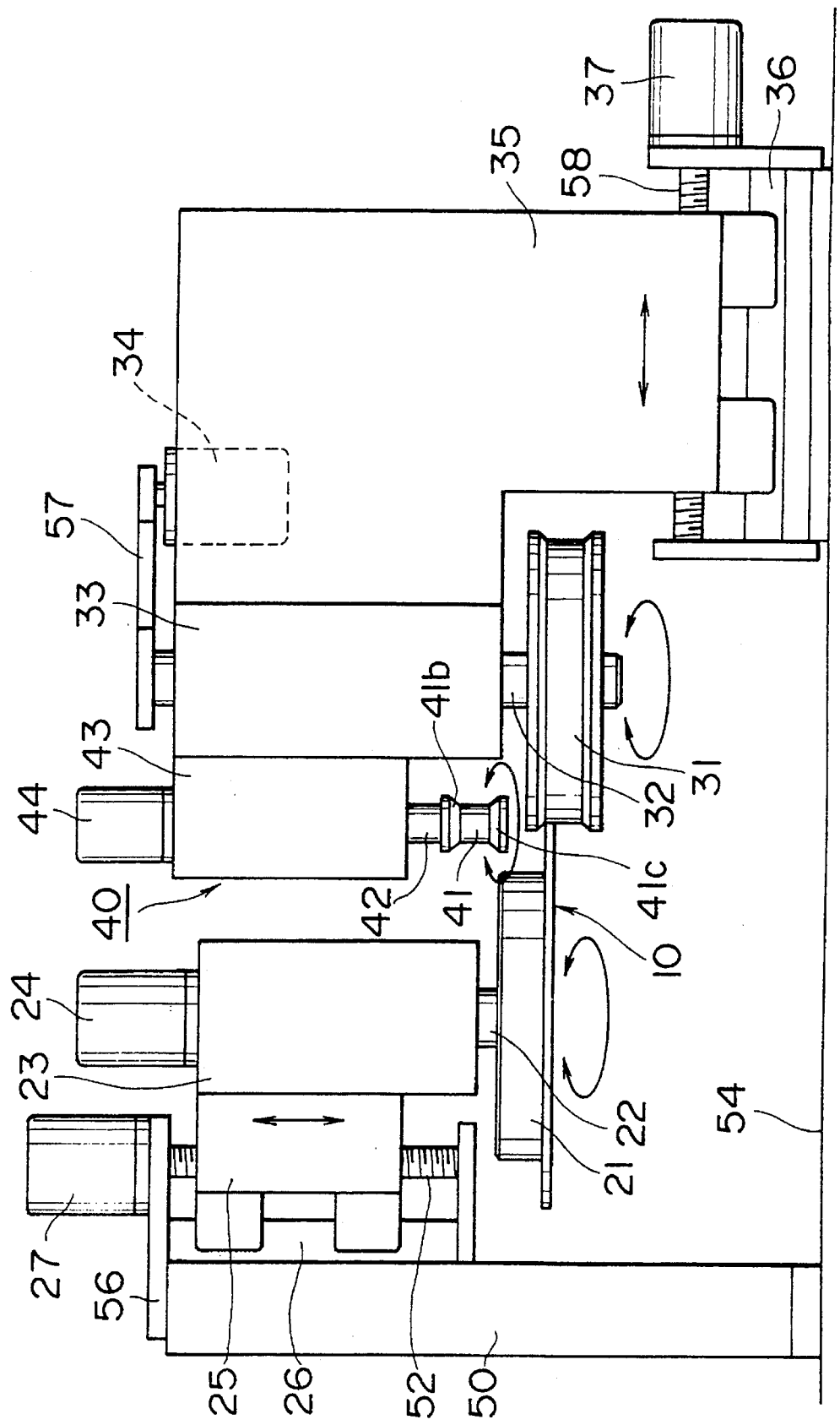
FIG. 1 is a view showing the essential portions of Embodiment 1 of a wafer chamfering machine according to the present invention.
Figure 2:
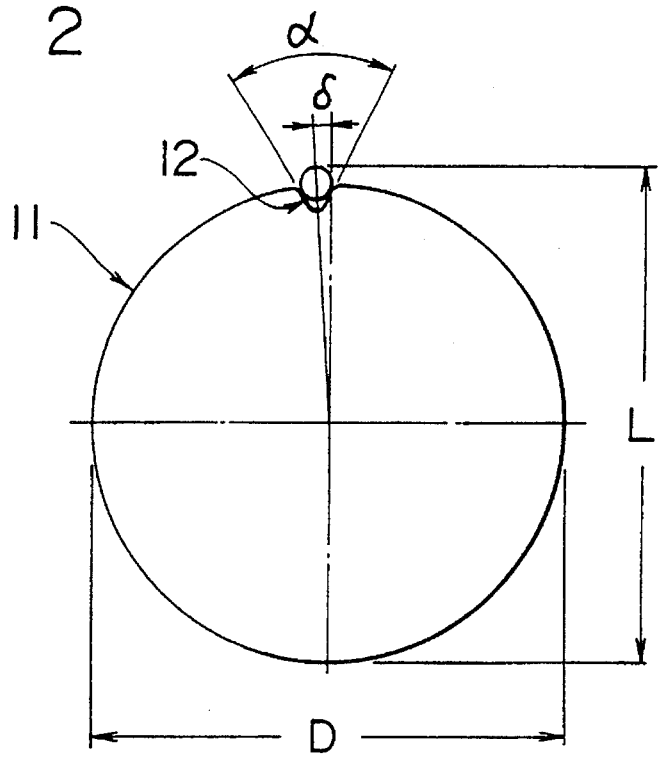
FIG. 2 is a view, showing an outer appearance of a wafer with a notch.
Figure 3:
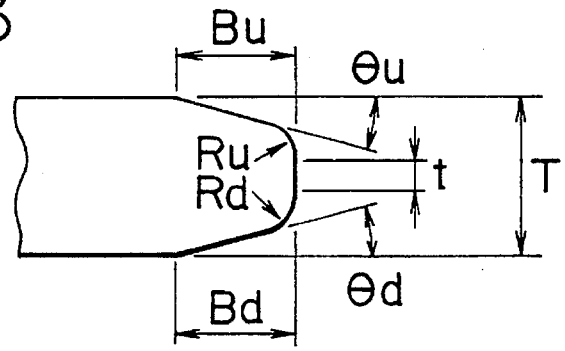
FIG. 3 is a view showing a shape of chamfering required for the wafer.

FIG. 1 shows the essential portions of Embodiment 1 of a wafer chamfering machine according to the present invention.

In FIG. 1, a wafer 10 is held through vacuum drawing and the like to an undersurface of a rotatable wafer table 21. A top surface of the wafer table 21 is secured to a table shaft 22 provided on a table shaft receiving rack 23, and the table shaft 22 is rotated by a motor 24. The table shaft receiving rack 23 is fixed to a vertical slider 25 which is vertically movably supported by a vertical guide 26 formed on a side surface of a post 50. Furthermore, the vertical slider 25 is threadably coupled to a lead screw 52 provided in the vertical direction. This lead screw 52 is drivably rotated by a motor 27, whereby the lead screws 52 is vertically moved along the vertical guide 26. The post 50 is erected on a floor surface 54, and the motor 27 is fixed to a plate 56 secured to a top end portion of the post 50. With this arrangement, the wafer 10 is rotatable in a state of being held by the wafer table 21 and also movable in the vertical direction.

Furthermore, designated at 31 is a grindstone for working on the outer periphery for chamfering the outer periphery of the wafer, which is secured to a grindstone shaft 32 provided on a grindstone shaft receiving rack 33. The grindstone shaft 32 is rotated by a motor 34 provided on a horizontal slider 35 through a belt 59 and the like. The grindstone shaft receiving rack 33 is fixed to the horizontal slider 35 which is horizontally movably supported by a horizontal guide 36 provided on the floor surface 54 in the directions of approaching the wafer table 21 or of retracting therefrom. Furthermore, the horizontal slider 35 is threadably coupled to a lead screw 58. This lead screw 58 is drivably rotated by a motor 37, whereby the lead screw 58 is horizontally moved along the horizontal guide 36. With this arrangement, the grindstone 31 for working on the outer periphery becomes rotatable and movable in the direction of the wafer table 21.

Further, a notch chamfering work unit 40 is provided on the side of the wafer table 21 of the grindstone shaft receiving rack 33. The notch chamfering work unit 40 consists of a notch working grindstone 41, a grindstone shaft 42, a grindstone shaft receiving rack 43 and a motor 44. The grindstone shaft 42 is rotated by the motor 44, whereby the notch working grindstone 41 is rotated. Furthermore, the notch chamfering work unit 40 is positioned upwardly of the grindstone 31 for working on the outer periphery, and a bottom end face of the notch working grindstone 41 and a to end face of the grindstone 31 for working on the outer periphery do not interfere with each other.

When chamferings of the outer periphery 11 of the wafer and chamfering of the notch 12 are performed by use of the constructed wafer chamfering machine, the wafer 10 is controlled in its positioning by a wafer alinement control section, not shown, in such a manner that the center of the outer periphery 11 coincides with the center of rotation of the wafer table 21, and thereafter, the wafer 10 is held by the wafer table 21 and positioned at a predetermined position (in the vertical direction) by the vertical slider 25.

Figure 4:
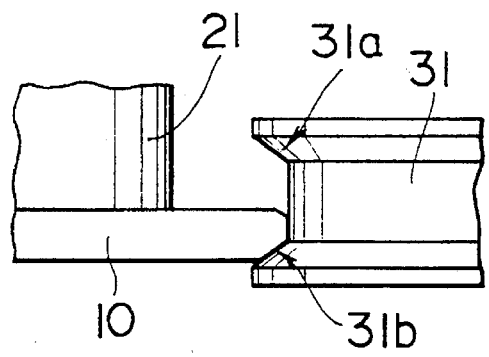
FIG. 4 is all view showing a shape of the outer periphery of a trapezoidal type grindstone.

Subsequently, the grindstone 31 for working on the outer periphery is rotated, moved in the direction of the wafer 10 by the horizontal slider 35, and the wafer table 21 is rotated. The interior of the grindstone 31 for working on the outer periphery is substantially trapezoidal shaped. The relationship of the vertical positions between the wafer 10 and grindstone 31 for working on the outer periphery is set in such a way that an upper tapered portion 31a (refer to FIG. 4) of the grindstone comes into contact with an edge portion on the side of a top surface of the outer periphery 11 of the wafer 10, so that chamfering of the outer periphery of the edge portion on the side of the top surface of the wafer 10 can be performed. When chamfering of the outer periphery on the side of the top surface of the wafer 10 is completed, the wafer table 21 is delivered downwardly by the vertical slider 25 such that the edge portion on the side of the bottom surface of the wafer comes into contact with the lower tapered portion 31b (refer to FIG. 4) of the grindstone 31 for working on the outer periphery, so that chamfering of the outer periphery of the bottom surface of the wafer 10 (the lower side in FIG. 1) can be performed.

However, contrary to the above-described contents of chamfering, as for the order of chamfering, there is such a method that, firstly, the edge portion on the side of the bottom surface of the wafer 10 is chamfered, and subsequently, the edge portion on the side of the top surface is chamfered. Either order may be adopted.

Figure 7:
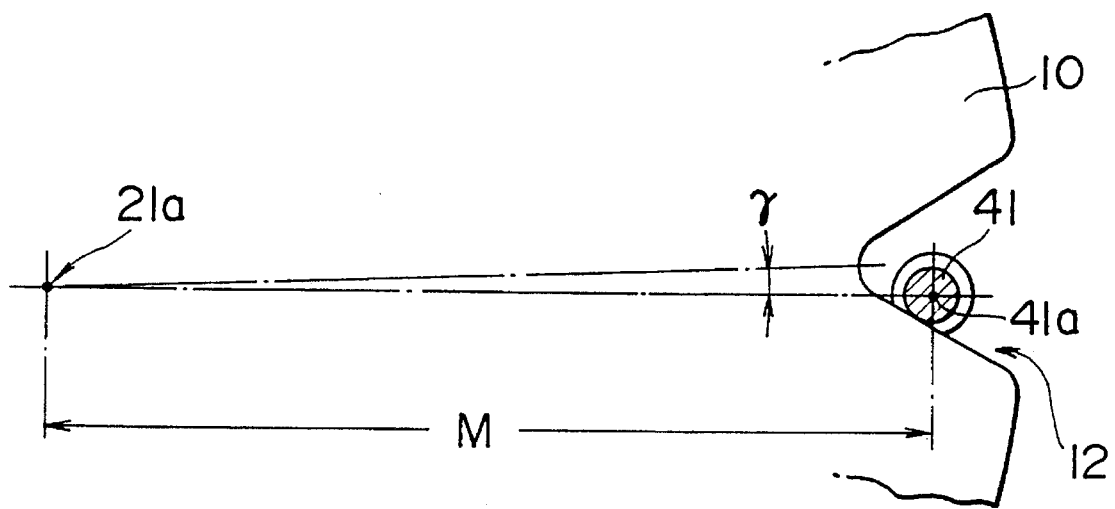
FIG. 7 is a view explaining chamfering work on a notch.

After chamfering of the outer periphery is completed, the grindstone 31 for working on the outer periphery and the notch working grindstone 41 are retracted by the horizontal slider 35 until they come off the outer periphery of the wafer 10, thereafter, the wafer table 21 is raised by the vertical slider 25 and positioned at a predetermined position (in the vertical direction) relative to the notch working grindstone 41. Subsequently, the notch working grindstone 41 is rotated and moved by the horizontal slider 35 in the direction of the wafer 10. An angle of rotation γ and a distance M between the center of rotation 21a of the wafer table 21 and the center of rotation 41a of the notch working grindstone 41 are controlled simultaneously in such a way that the notch working grindstone 41 follows a V shape of the notch 12 as shown in FIG. 7. That is, the distance M is varied by the horizontal slider 35 while the angle of rotation γ is controlled, whereby the notch 12 is chamfered. The interior of the notch working grindstone 41 is substantially trapezoidal shaped and the relationship in the vertical positions between the wafer 10 and the notch performing grindstone 41 is set in such a way that a tapered portion 41b comes into contact with the edge portion on the side of the top surface of the wafer 10, so that chamfering of the notch on the side of the top surface of the wafer 10 can be performed.

When chamfering of the notch on the top surface of the wafer 10 is completed, the wafer table 21 is delivered upwardly by the vertical slider 25 such that the edge portion on the bottom surface of the wafer 10 comes into contact with the lower tapered portion 41c of the notch working grindstone 41, similarly to the upper side, the angle of rotation γ of the wafer table 21 and the distance M between the center of rotation of the wafer table 21 and the center of rotation 41a of the notch working grindstone 41 are controlled simultaneously, so that chamfering of the notch on the side of the bottom surface of the wafer 10 can be performed.

However, similarly to the case of chamfering the outer periphery, the order of chamfering contrary to the above-described content may be adopted.

Figure 6:
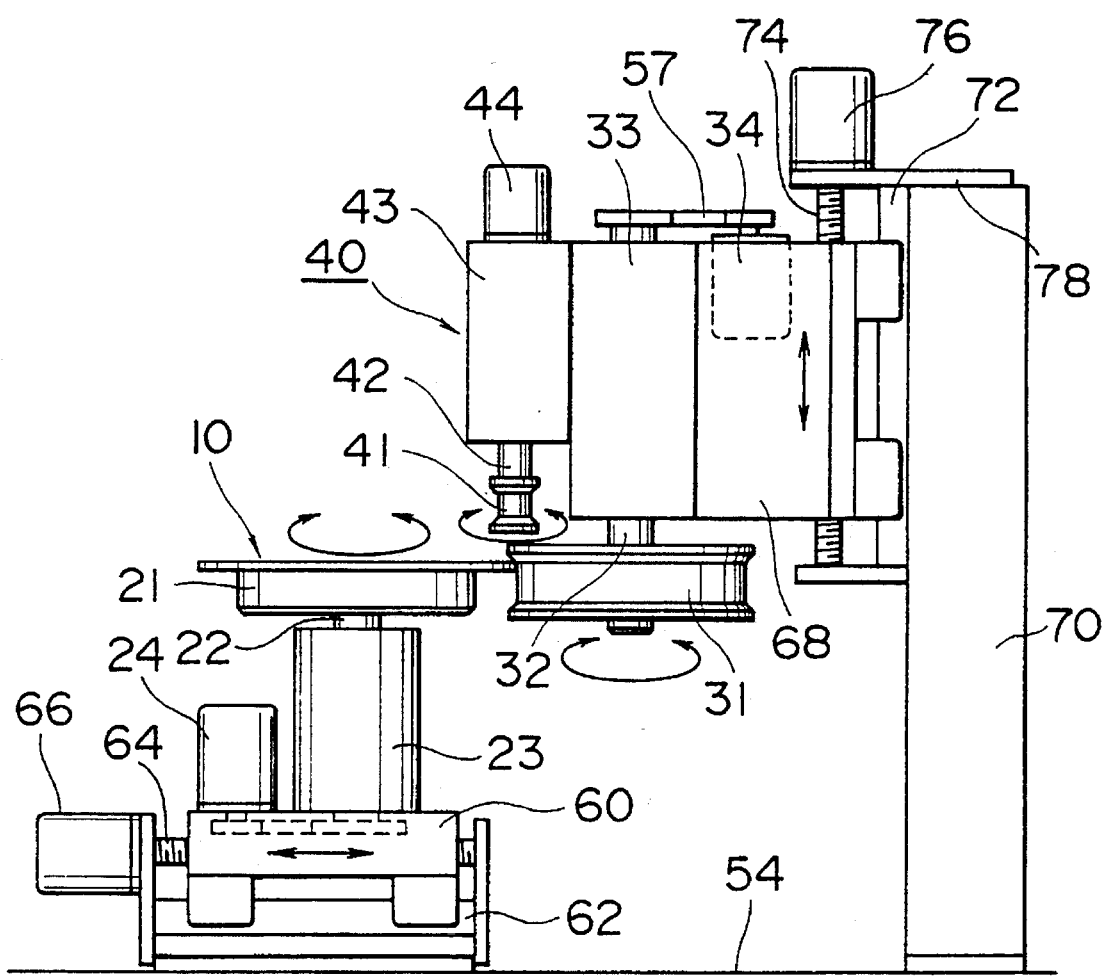
FIG. 6 is a view showing the essential portions of Embodiment 2 of the wafer chamfering machine according to the present invention.

FIG. 6 shows the essential portions of Embodiment 2 of the wafer chamfering machine according to the present invention, and same reference numerals are used to designate the same or similar parts corresponding to ones as shown in Embodiment 1 of FIG. 1. The wafer chamfering machine shown in Embodiment 2 is constructed such that the side of the wafer table 21 is made horizontally movable and the side of the grindstone 31 for working on the outer periphery and the notch working grindstone 41 is made vertically movable.

The wafer table 21 is rotatably supported by the table shaft receiving rack 23 with a holding surface of the wafer 10 being directed upwardly. The table shaft receiving rack 23 is erected on a horizontal slider 60 which is horizontally movably supported by a horizontal guide 62 provided on the floor surface 54. Furthermore, the horizontal slider 60 is threadably coupled to a lead screw 64 provided horizontally. This lead screw 64 is drivably rotated by a motor 66, whereby the horizontal slider 60 is horizontally moved along the horizontal guide 62 in the direction of approaching the grindstone 31 for working on the outer periphery or of retracting therefrom. Furthermore, the motor 24 for rotating the wafer table 21 is provided on the horizontal slider 60, and the turning force of this motor 24 is imported to the table shaft 22 through a belt or the like.

On the other hand, the grindstone shaft receiving rack 33 on the side of the grindstone 31 for working on the outer periphery is fixed to a vertical slider 68 which is vertically movably supported by a vertical guide 72 formed on a side surface of a post 70. Furthermore, the vertical slider 68 is threadably coupled to a lead screw 74 provided vertically. This lead screw 74 is drivably rotated by a motor 76, whereby the vertical slider 68 is vertically moved along the vertical guide 72. The post 70 is erected on the floor surface 54, and the motor 76 is secured to a plate 78 fixed to a top end portion of the post 70.

Accordingly, in the case of Embodiment 2, when the wafer 10 is controlled in its posture and held by the wafer table 21, the grindstone 31 for working on the outer periphery is positioned (in the vertical direction) at a predetermined position, and the wafer table 21 is moved by the horizontal slider 60 in the direction of the grindstone 31 for working on the outer periphery, whereby chamfering of the outer periphery of the wafer 10 is performed.

When chamfering of the outer periphery is completed, the horizontal slider 60 is retracted until the positions of the grindstone 31 for working on the outer periphery and the notch working Grindstone 41 are separated from the outer periphery 11 of the wafer 10, and thereafter, the notch working grindstone 41 is lowered by the vertical slider 68, whereby the notch working Grindstone 41 is positioned (in the vertical direction) at a predetermined position relative to the wafer 10. Subsequently, the wafer table 21 is moved by the horizontal slider 60 in the direction of the notch working grindstone 41, and the angle of rotation γ of the wafer table 21 and the distance M between the center of rotation 21a of the wafer table 21 and the center of rotation 41a of the notch working stone 41 are controlled simultaneously along the shape of the notch 12, whereby chamfering of the notch of the wafer 10 is performed.

Figure 8:
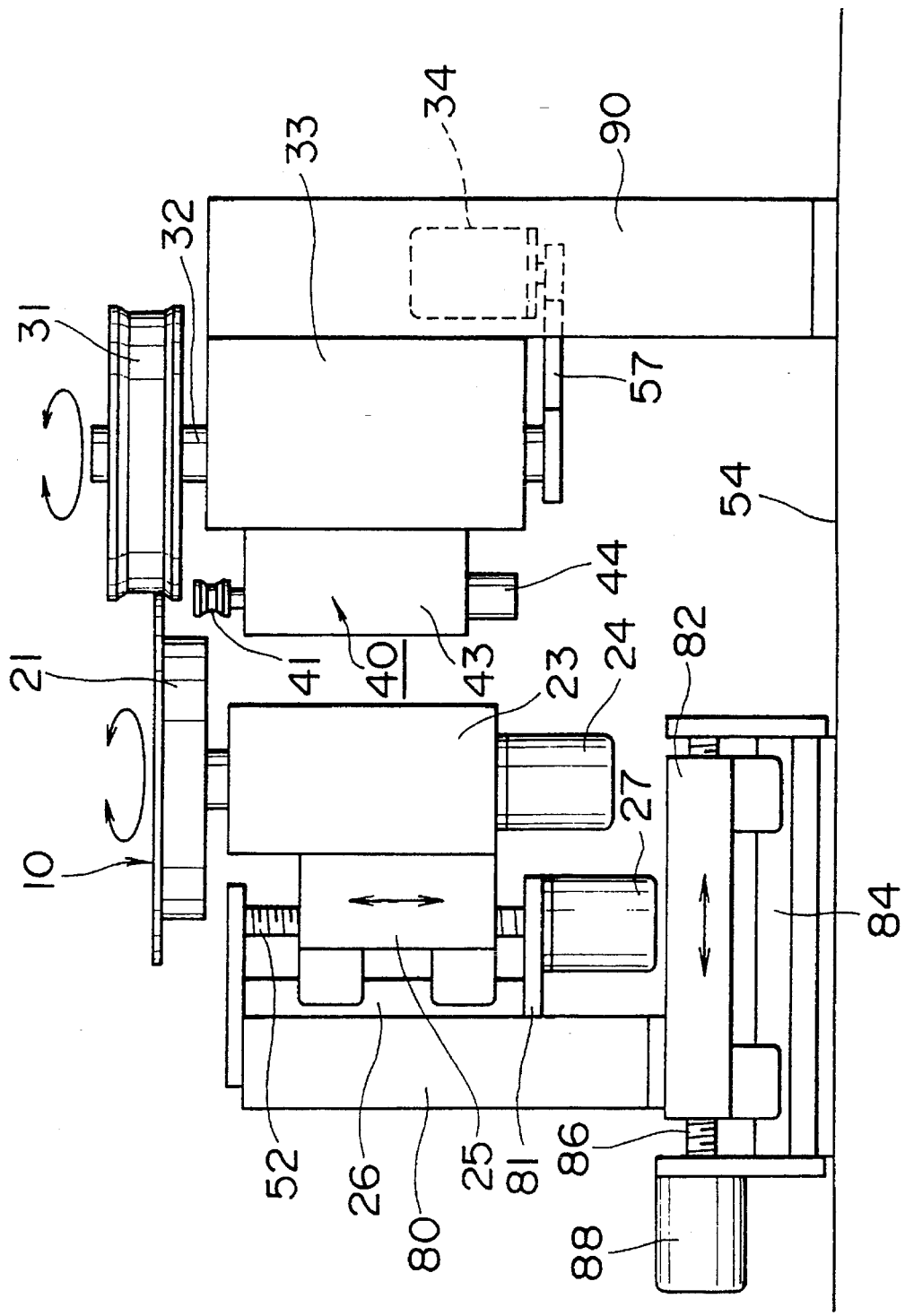
FIG. 8 is a view showing the essential portions of Embodiment 3 of the wafer chamfering machine according to the present invention.

FIG. 8 shows the essential portions of Embodiment 3 of the wafer chamfering machine according to the present invention, and same reference numerals are used to designate same or similar parts corresponding to ones as shown in Embodiment 1 of FIG. 1. The wafer chamfering machine shown in Embodiment 3 is constructed such that the side of the wafer table 21 is made movable vertically an horizontally.

As shown in FIG. 8, the wafer table 21 is rotatably supported by the table shaft receiving rack 23 with the sucking surface of the wafer 10 being directed upwardly. The table shaft receiving rack 23 is fixed to the vertical slider 25 which is vertically movably supported on the vertical guide 26 formed on a side surface of a post 80. Furthermore, the vertical slider 25 is threadably coupled to the lead screw 52. This lead screw 52 is drivably rotated by the motor 27, whereby the vertical slider 25 is moved vertically along the vertical guide 26. The motor 27 is fixed to an undersurface of a plate 81 extended from a side surface of the post 80.

The post 80 is erected on a horizontal slider 82 which is horizontally movably supported by a horizontal guide 84 provided on the floor surface 54. Furthermore, the horizontal slider 82 is threadably coupled to a lead screw 86. This lead screw 86 is drivably rotated by a motor 88, whereby the horizontal slider 82 is horizontally moved along the horizontal guide 84 in the direction of approaching the grindstone 31 for working on the outer periphery or of retracting therefrom.

On the other hand, the grindstone 31 for working on the outer periphery is disposed at the upward end of the grindstone shaft receiving rack 33 which is fixed to a post 90. The post 90 is fixed to the floor surface 54. Furthermore, the notch performing grindstone 41 is disposed at upward end of the grindstone shaft receiving rack 43 and downwardly from the grindstone 31 for working on the outer periphery.

Accordingly, in the case of Embodiment 3, when the wafer 10 is controlled in its posture and held by the wafer table 21, the wafer 10 is positioned (in the vertical position) at a predetermined position by the vertical slider 25 and moved in the direction of the grindstone 31 for working on the outer periphery by the horizontal slider 82, whereby chamfering of the outer periphery of the wafer 10 is performed.

When chamfering of the outer periphery is completed, the horizontal slider 82 is retracted until the outer periphery 11 of the wafer 10 is separated from the grindstone 31 for working on the outer periphery and the notch performing grindstone 41, and the wafer 10 is lowered by the vertical slider 25 and positioned (in the vertical direction) at a predetermined position relative to the notch performing grindstone 41. Subsequently, the wafer 10 is moved by the horizontal slider 82 in the direction of the notch performing grindstone 41, and the angle of rotation γ of the wafer table 21 and the distance M between the center of rotation 21a of the wafer table 21 and the center of rotation 41a of the notch performing grindstone 41 are controlled simultaneously along the shape of the notch 12, whereby chamfering of the notch of the wafer 10 is performed.

Incidentally, as the basic constructions of the wafer chamfering machine other than the basic constructions shown in Embodiments 1 through 3, there is a construction, in which, as for the side of the wafer table 21, the wafer table 21 is moved horizontally with the wafer table being directed downwardly, another construction, in which, as for the side of the grindstones, the grindstone shaft receiving racks 33 and 43 are provided downwardly of the wafer 10 and moved horizontally or vertically, and so forth. The present invention should not necessarily be limited to the wafer chamfering machines having the basic construction as shown in Embodiments 1 through 3, and the present invention is applicable to such a construction, in which, by the combination of the above-described constructions, relative positions between the side of the wafer table 21 and the side of the grindstone allow the wafer chamfering machine to move vertically and horizontally.

Similarly, the present invention is applicable to other rotation transmitting mechanisms for the wafer table 21, the grindstone 31 for working on the outer periphery and the notch performing grindstone 41 and other driving mechanisms for the vertical slider 25 and the horizontal slider 35 than the mechanisms in the wafer chamfering machines shown in Embodiments 1 through 3.

Figure 5:
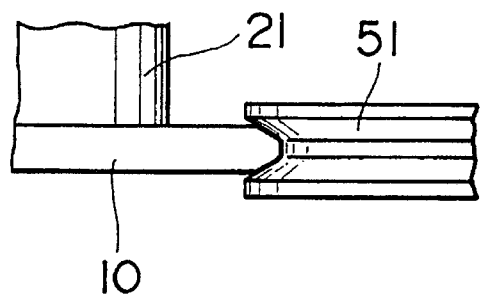
FIG. 5 is a view showing a shape of the outer periphery of a formed type grindstone.

Furthermore, description has been given of the case where the grindstone 31 for working on the outer periphery and the notch performing grindstone 41 are of trapezoidal type grindstones, however, the present invention should not necessarily be limited to this, and the present invention is applicable to the case where the formed type grindstone 51 as shown in FIG. 5 is used for the grindstone 31 for working on the outer periphery and/or the notch performing grindstone 41, so that the grindstone does not move vertically and the both surfaces can be chamfered only once.

As has been described hereinabove, according to the present invention, the wafer chamfering machine, wherein the rotatable wafer table 21 and the rotatable grindstone 31 for working on the outer periphery 31 are made relatively vertically and horizontally movable, the wafer is fixed to the wafer table 21, relative vertical positions between the wafer table 21 and the grindstone 31 for working on the outer periphery are set, and the wafer table 21 and the grindstone 31 for working on the outer periphery are made to relatively approach each other with the wafer table 21 and the grindstone 31 for working on the outer periphery being rotated, to thereby chamfer the outer periphery of the wafer, which is characterized in that the notch chamfering work unit 40 is provided on the side of the wafer table 21 of the grindstone shaft receiving rack 33 of the grindstone 31 for working on the outer periphery at a position not interfering with the grindstone 31 for working on the outer periphery, whereby, by mounting the wafer on the wafer table 21 only once, chamfering of the outer periphery of the wafer and chamfering the notch are performed, so that chamfering of the notch of the wafer can be accurately performed, the space of the wafer chamfering machines is compact size, the costs are low, and further, the wafer chamfering machine requiring further shorter time for chamfering can be provided.

It should be understood, however, that there is no intention to limit the invention to the specific forms disclosed, but on the contrary, the invention is to cover all modifications, alternate constructions and equivalents falling within the spirit and scope of the invention as expressed in the appended claims.

We claim:

1. A wafer chamfering machine comprising:

a wafer holding unit provided with a wafer table for holding a wafer and a motor for drivably rotating the wafer table;

a vertical direction moving mechanism for moving the wafer holding unit in the vertical direction;

a chamfering unit opposed to the wafer holding unit and provided with a grindstone for chamfering an outer periphery of the wafer and a motor for drivably rotating the grindstone for chamfering the outer periphery of the wafer;

a notch chamfering unit mounted on the chamfering unit, disposed at a position not interfering with the grindstone for chamfering the outer periphery of the wafer, and provided with a notch working grindstone for chamfering a notch formed on the outer periphery of the wafer and a motor for drivably rotating the notch working grindstone; and a horizontal direction moving mechanism for moving the chamfering unit and the notch chamfering unit toward and away from the wafer holding unit in the horizontal direction, wherein rotational axes of the wafer table, the grindstone for chamfering the outer periphery of the wafer and the notch working grindstone are substantially parallel to one another and arranged along a line extending parallel to the direction of movement of the chamfering unit.

2. A wafer chamfering machine as set forth in claim 1, wherein an angle of rotation of said wafer table and a distance between a center of rotation of said wafer table and a center of rotation of the notch working grindstone of said notch chamfering unit are controlled simultaneously, whereby chamfering of the notch is performed.

3. A wafer chamfering machine as set forth in claim 1, wherein said notch working grindstone of the notch chamfering unit is formed with a first tapered portion for chamfering an edge portion on the side of a top surface of the notch formed on said wafer and a second tapered portion for chamfering an edge portion on the side of a bottom surface of said notch.

4. A wafer chamfering machine comprising:

a wafer holding unit provided with a wafer table for holding a wafer and a motor for drivably rotating the wafer table;

a chamfering unit opposed to the wafer holding unit and provided with a grindstone for chamfering an outer periphery of the wafer and a motor for drivably rotating the grindstone for chamfering the outer periphery of the wafer;

a notch chamfering unit mounted on the chamfering unit and provided with a notch working grindstone disposed at a position not interfering with the grindstone for chamfering the outer periphery of the wafer for chamfering a notch formed on the outer periphery of the wafer and a motor for drivably rotating the notch working grindstone;

a vertical direction moving mechanism for moving the chamfering unit and the notch chamfering unit in the vertical direction; and a horizontal direction moving mechanism for moving the wafer holding unit toward and away from the chamfering unit and the notch chamfering unit in the horizontal direction, wherein rotational axes of the wafer table, the grindstone for chamfering the outer periphery of the wafer and the notch working grindstone are parallel to one another and arranged along a line extending parallel to the direction of movement of the wafer table.

5. A wafer chamfering machine as set forth in claim 4, wherein an angle of rotation of said wafer table and a distance between a center of rotation of said wafer table and a center of rotation of the notch working grindstone of said notch chamfering unit are controlled simultaneously, whereby chamfering of the notch is performed.

6. A wafer chamfering machine as set forth in claim 4, wherein said notch working grindstone of the notch chamfering unit is formed with a first tapered portion for chamfering an edge portion on the side of a top surface of the notch formed on said wafer and a second tapered portion for chamfering an edge portion on the side of a bottom surface of said notch.

7. A wafer chamfering machine comprising:

a wafer holding unit including a wafer table for holding a wafer and a motor for drivably rotating the wafer table;

a vertical direction moving mechanism for moving the wafer holding unit in the vertical direction;

a chamfering unit opposed to the wafer holding unit and provided with a grindstone for chamfering an outer periphery of the wafer and a motor for drivably rotating the grindstone for chamfering the outer periphery of the wafer;

a notch chamfering unit mounted on the chamfering unit and provided with a notch working grindstone disposed at a position not interfering with the grindstone for chamfering the outer periphery of the wafer for chamfering a notch formed on the outer periphery of the wafer and a motor for drivably rotating the notch working grindstone; and a horizontal direction moving mechanism for linearly moving the wafer holding unit toward and away from the chamfering unit and the notch chamfering unit in the horizontal direction, wherein rotational axes of the wafer table, the grindstone for chamfering the outer periphery of the wafer and the notch working grindstone are arranged parallel to one another and along a line extending parallel to a direction of horizontal movement of the wafer holding unit.

8. A wafer chamfering machine as set forth in claim 7, wherein an angle of rotation of said wafer table and a distance between a center of rotation of said wafer table and the center of rotation of a notch working grindstone of said notch chamfering unit are controlled simultaneously, whereby chamfering of the notch is performed.

9. A wafer chamfering machine as set forth in claim 7, wherein said notch working grindstone of the notch chamfering unit is formed with a first tapered portion for chamfering an edge portion on the side of a top surface of the notch formed on said wafer and a second tapered portion for chamfering an edge portion on the side of a bottom surface of said notch.

* * * * *